United States Patent
Shim et al.

(10) Patent No.: US 9,214,197 B2
(45) Date of Patent: Dec. 15, 2015

(54) SECONDARY MEMORY DEVICE AND ELECTRONIC SYSTEM EMPLOYING THE SAME

(71) Applicant: Samsung Electronics Co., Ltd., Suwon-si, Gyeonggi-do (KR)

(72) Inventors: In-bo Shim, Osan-si (KR); Cheol Kwon, Suwon-si (KR); Jong-yun Yun, Yongin-si (KR); Yeong-kyun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 14/077,435

(22) Filed: Nov. 12, 2013

(65) Prior Publication Data

US 2014/0133258 A1    May 15, 2014

(30) Foreign Application Priority Data

Nov. 13, 2012  (KR) .......................... 10-2012-0128266

(51) Int. Cl.
  *G11C 5/14*   (2006.01)
(52) U.S. Cl.
  CPC ...................................... *G11C 5/141* (2013.01)
(58) Field of Classification Search
  CPC .. G06T 7/0057; G11C 5/141; G11C 11/5621; G11C 11/5671; G11C 16/26; G11C 16/3431; G11C 16/3459
  USPC .................. 365/185.09, 185.11, 185.25, 229, 365/185.22
  See application file for complete search history.

(56) References Cited

U.S. PATENT DOCUMENTS

| | | | |
|---|---|---|---|
| 7,003,620 B2 | 2/2006 | Avraham et al. | |
| 7,126,857 B2 | 10/2006 | Hajeck | |
| 2003/0115978 A1* | 6/2003 | Moehnke et al. | ............ 73/866.5 |
| 2010/0146333 A1 | 6/2010 | Yong et al. | |
| 2010/0181605 A1 | 7/2010 | Mayya et al. | |
| 2010/0250830 A1 | 9/2010 | Stenfort | |
| 2011/0031811 A1 | 2/2011 | Park et al. | |
| 2011/0089922 A1 | 4/2011 | Kitakawa | |
| 2011/0271143 A1 | 11/2011 | Cho | |
| 2012/0032513 A1 | 2/2012 | Tsu et al. | |
| 2012/0319659 A1* | 12/2012 | Kinoshita et al. | ............. 320/134 |

FOREIGN PATENT DOCUMENTS

| | | |
|---|---|---|
| JP | 2005-327210 | 11/2005 |
| KR | 1020110016134 | 2/2011 |

* cited by examiner

*Primary Examiner* — Thong Q Le
(74) *Attorney, Agent, or Firm* — EIPG, PLLC

(57) ABSTRACT

A secondary memory device includes a substrate configured to receive power from an external power source, at least one of non-volatile memory devices mounted on the substrate, a control device mounted on the substrate to control the non-volatile memory devices, and a secondary battery electrically connected to the substrate and configured to supply second power to the substrate when a power supply from the external power source is abnormally stopped.

18 Claims, 5 Drawing Sheets

SECONDARY MEMORY DEVICE AND ELECTRONIC SYSTEM EMPLOYING THE SAME

CROSS-REFERENCE TO RELATED APPLICATIONS

This application claims priority under 35 U.S.C. §119 from Korean Patent Application No. 10-2012-0128266, filed on Nov. 13, 2012, in the Korean Intellectual Property Office, the disclosure of which is incorporated herein in its entirety by reference.

BACKGROUND

1. Field

The inventive concept relates to a secondary memory device and an electronic system employing the same, and more particularly, to a secondary memory device that is inexpensive and has a small volume and an electronic system employing the same.

2. Description of the Related Art

There is continued demand for increasing performance and improving reliability of various systems, and accordingly, performance increase and reliability improvement of server systems and personal computer systems continue to be achieved. These efforts also have been made in secondary memory device fields. A super capacity is used for a power supply source for recording information in a secondary memory device when a main power supply to a system is suddenly stopped.

SUMMARY OF THE INVENTION

The inventive concept provides a secondary memory device that is inexpensive and has a small volume.

The inventive concept provides an electronic system employing a secondary memory device that is inexpensive and has a small volume.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a secondary memory device including a substrate configured to receive power from an external power source, at least one non-volatile memory device mounted on the substrate, a control device mounted on the substrate to control the at least one non-volatile memory device, and a secondary battery electrically connected to the substrate and configured to supply secondary power to the substrate when the power supply from the external power source is abnormally stopped.

The secondary memory device may further include a charge controller to control charging of the secondary battery.

The secondary battery may have a thickness in a range from about 0.5 mm to about 2 mm in a direction perpendicular to a main surface of the substrate.

The secondary memory device may further include a sensing device to sense the power supply from the external power source to determine whether the power supply is normal or not, and a discharge switch configured to supply the secondary power to the substrate in response to a signal received from the sensing device when the power supply from the external power source is abnormally stopped.

The substrate and the secondary battery may be respectively accommodated in separate housings. In a first housing where the substrate is accommodated and a second housing where the secondary battery is accommodated, the second housing may be attachably and detachably combined with the first housing. The second housing may be configured to be spontaneously separated from the first housing when the secondary battery is exploded. The second housing may be combined with the first housing in an insertion type, and the second housing may be configured to be separated from the first housing by releasing the insertion if the secondary battery explodes.

The second housing may include an opening to supply air in the second housing. Also, a charging time of the secondary battery may be one minute or less.

A device to boost a voltage is not interposed between the secondary battery and the substrate.

The foregoing and/or other features and utilities of the present general inventive concept may also be achieved by providing an electronic system including a central processing device, a main memory device to store data processed in the central processing device, an input device to input information to the central processing device, an output device to output information from the central processing device, and a secondary memory device to transmit information to the central processing device or to store information output from the central processing device. The secondary memory device may include a substrate configured to receive power from an external power source, at least one non-volatile memory device mounted on the substrate, a control device mounted on the substrate to control the at least one non-volatile memory device, and a secondary battery electrically connected to the substrate and configured to supply secondary power to the substrate when the power supply from the external power source is abnormally stopped.

The secondary memory device may further include a sensing device to sense the power supply from the external power source to determine whether the power supply is normal or not, and a discharge switch configured to supply the secondary power to the substrate in response to a signal received from the sensing device when the power supply from the external power source is abnormally stopped.

The electronic system may be configured to read out data stored in the main memory device and to record the data in the non-volatile memory devices of the secondary memory device while power is supplied from the secondary battery to the substrate when the power supply from the external power source is abnormally stopped.

The secondary memory device may be configured such that, after all data in the main memory device is recorded in the non-volatile memory devices of the secondary memory device, the power supply from the secondary battery is blocked.

When the secondary memory device according to the current inventive concept is used, a further inexpensive and small size secondary memory device may be provided.

The electronic system may further include a power supply device to receive the power from the external power and to provide a power supply to the central processing unit and to selectively provide another power supply to the secondary battery device.

The electronic system may further include a housing having a terminal to be electrically connected to the secondary memory device.

The electronic system may further include a housing having a terminal, and the secondary memory device may include a first housing accommodating the substrate, the at least one non-volatile memory device, and the controller, and a second housing accommodating the secondary battery, and the terminal is connected to the first housing.

The electronic system may further include a housing having a terminal, and the secondary memory device may include a first housing accommodating the substrate, the at least one non-volatile memory device, and the controller, and a second housing accommodating the secondary battery, and the terminal is connected to the second housing for power supply and data exchange therebetween.

The electronic system may be a desktop personal computer (PC), a laptop PC, a mobile computing apparatus, a smart phone, a tablet PC, a portable multimedia player (PMP), a navigation system, a flat panel display device, a curved panel display, or a flexible panel display.

The foregoing and/or other features and utilities of the present general inventive concept may also be achieved by providing a method of a secondary memory device, including providing a substrate configured to receive power from an external power source, providing at least one non-volatile memory device mounted on the substrate, controlling the at least one non-volatile memory device using a control device mounted on the substrate, and supplying a secondary power to the substrate when the power supply from the external power source is abnormally stopped, using a secondary battery electrically connected to the substrate.

The foregoing and/or other features and utilities of the present general inventive concept may also be achieved by providing. A non-transitory computer-readable medium to contain computer-readable codes as a program to execute the method describe above or hereinafter.

The foregoing and/or other features and utilities of the present general inventive concept may also be achieved by providing a secondary memory device including a substrate to receive a first power supply from an external device, at least one non-volatile memory device mounted on the substrate, and a secondary battery to provide a second power supply to the substrate when the first power supply is terminated from the external device.

The foregoing and/or other features and utilities of the present general inventive concept may also be achieved by providing an electronic system having a power source, including a housing having a central processing device, a main memory device, and a terminal to operate according to a first power supply from the power source, and a secondary memory device connected to the terminal to transmit information to the central processing device or to store information output from the central processing device. The secondary memory device may include a substrate to receive the first power supply from the terminal, at least one non-volatile memory device mounted on the substrate, and a secondary battery to provide a second power supply to the substrate when the first power supply is terminated from the terminal.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
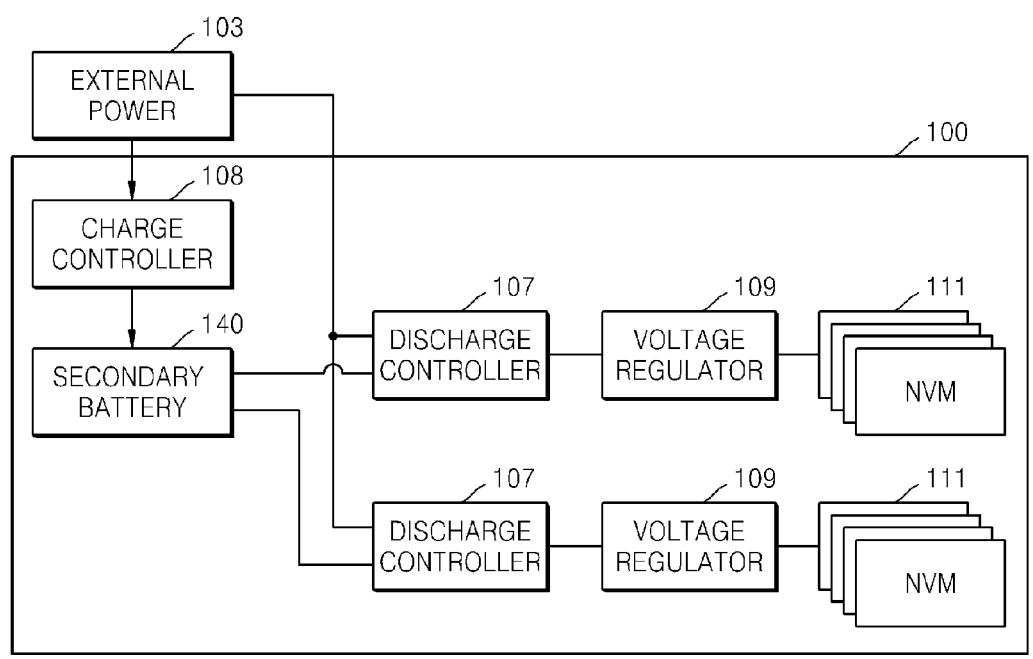
FIG. 1 is a block diagram illustrating a circuit configuration of a secondary memory device according to an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. Also, various elements and regions are schematically drawn. Accordingly, the current inventive concept is not limited to the relative size and gaps shown in the drawings.

It will be understood that, although the terms first, second, third, etc., may be used herein to describe various elements, these elements should not be limited by these terms. These terms are only used to distinguish one element, component, region, layer or section from another region, layer or section. For example, without departing from the scope of the inventive concept, a first constituent element may be designated as a second constituent element, and similarly, the second constituent element may be designated as the first constituent element.

The terminologies used herein are for the purpose of describing particular embodiments only and are not intended to be limiting of the inventive concept. As used herein, singular forms are intended to include plural forms as well, unless the context clearly indicates otherwise. It will be further understood that the terms "comprise" and/or "comprising," when used in this specification, specify the presence of stated features, steps, operations, and/or components, but do not preclude the presence or addition of one or more other features, steps, operations, and/or components, and/or groups thereof.

Unless otherwise defined, all terms including technical and scientific terms used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
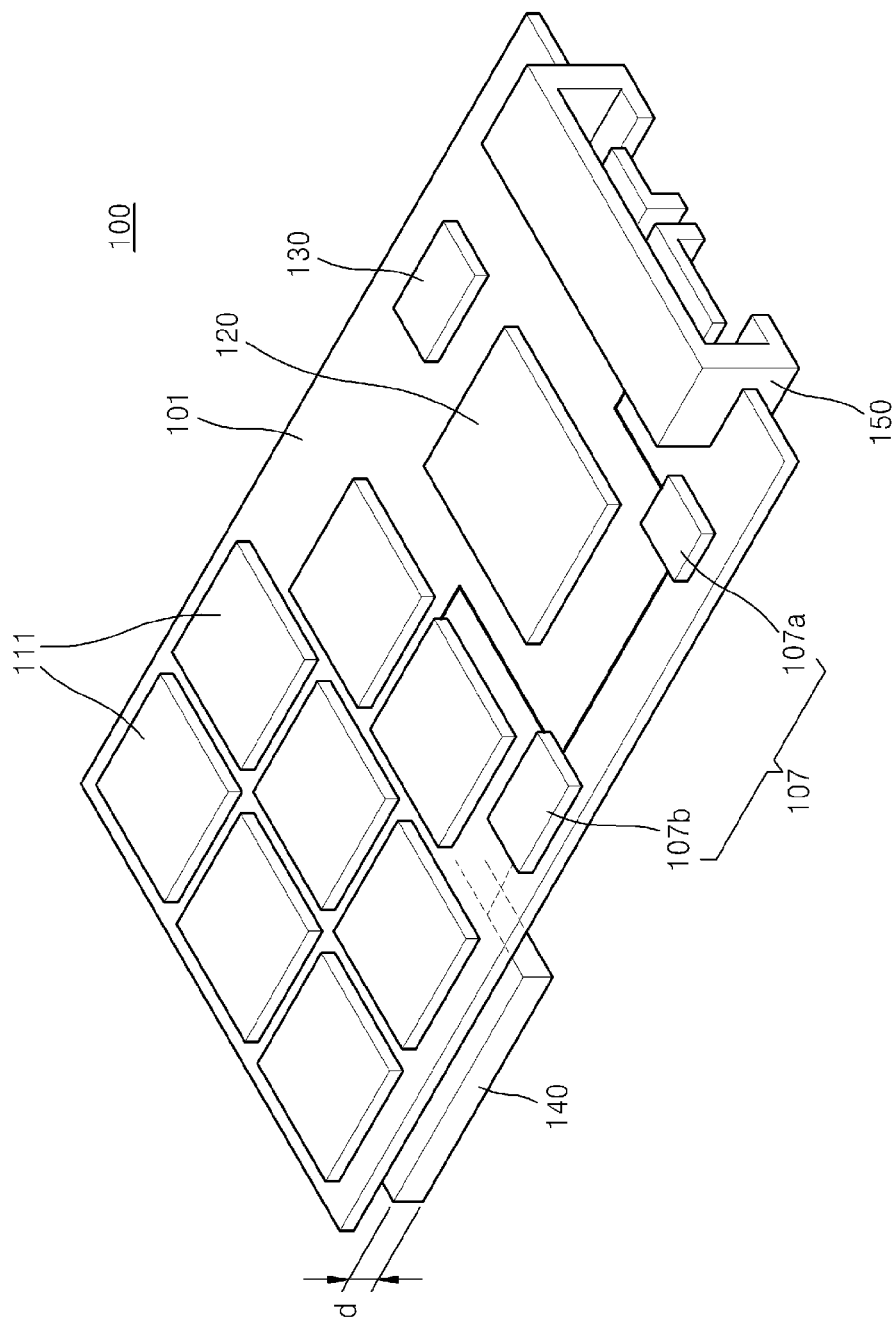
FIG. 2 is a schematic conceptual perspective view illustrating a secondary memory device according to an embodiment of the inventive concept.

FIG. 1 is a block diagram illustrating a circuit configuration of a secondary memory device 100 according to an embodiment of the inventive concept. FIG. 2 is a schematic conceptual perspective view illustrating the secondary memory device 100 according to an embodiment of the inventive concept.

Referring to FIGS. 1 and 2, the secondary memory device 100 includes a substrate 101 on which at least one of non-volatile memory devices 111 is mounted. The substrate 101 may be, for example, a printed circuit board (PCB) or a flexible printed circuit board, (FPCB). The substrate 101 may include a connection element such as a connector 150 to receive power from an external power source 103. The connector 150 may have a first connector for power supply and a second connector for data communication between components of the substrate 101 and an external device. The connector 150 may be connected to components of the secondary memory device 100 through conductive lines (not illustrated).

The non-volatile memory devices 111 may be, for example, a flash memory, a phase-change random access memory (PRAM), a resistive RAM (RRAM), a ferroelectric RAM (FeRAM), or a magnetic RAM (MRAM), but the inventive concept is not limited thereto. The flash memory may be a NAND flash memory. Each of the non-volatile memory devices 111 may be a single semiconductor die or a stack of semiconductor dies.

A control device 120 may further be included in the substrate 101 to control the non-volatile memory devices 111.

The control device 120 may perform functions of wear leveling, error correction, and/or fail block control. Also, the control device 120 may include a program for exchanging signals with external devices in a method according to a serial advanced technology attachment (SATA) standard, a parallel ATA (PATA) standard, or a small computer system interface (SCSI) standard. Here, the SATA standard includes all SATA group standards, such as SATA-2, SATA-3, e-SATA (external SATA) as well as SATA-1. The PATA standard includes all integrated drive electronic (IDE) group standards, such as IDEs and enhanced-IDE (E-IDE). The present application incorporates the standards of serial ATA revision 2.6 published by the Serial ATA International Organization on Feb. 15, 2007 by reference in its entirety.

A volatile memory device 130 may further be mounted on the substrate 101. The non-volatile memory device 130 may be, for example, a dynamic random access memory (DRAM) device. The volatile memory device 130 may perform a buffer function in data exchange between the non-volatile memory devices 111 and the control device 120.

A secondary battery 140 may be electrically connected to the substrate 101. In FIG. 2, the secondary battery 140 is depicted extremely close to the substrate 101. However, the secondary battery 140 may not be necessarily mounted on the substrate 101, but it is sufficient for the secondary battery 140 to be electrically connected to the substrate 101. That is, the secondary battery 140 may be directly mounted on the substrate 101 or may be disposed close to the substrate 101 without being directly mounted on the substrate 101. The secondary battery 140 may be electrically connected to the substrate 101. When the secondary battery 140 is directly mounted on the substrate 101, the mounting location may be an arbitrary location of the substrate 101. More specifically, the secondary battery 140 may be disposed on an arbitrary location, for example, an upper surface, a lower surface, and/or a lateral surface.

The secondary battery 140 may be, for example, an arbitrary second battery, for example, a lithium ion battery, a lithium polymer battery, a nickel metal hydride battery (NiMH), a nickel cadmium battery, or a lithium air battery. Among the various secondary batteries described above, the secondary battery 140 may be at least one of the second batteries. A circuit and a part for driving and controlling charging and discharging of the selected secondary battery may be further included on the substrate 101.

The lithium polymer battery may be a completely solid type lithium polymer battery formed with a polymer electrolyte which does not include an organic electrolyte or a lithium ion polymer battery formed with a gel type polymer electrolyte that includes an organic electrolyte.

A secondary battery cell may include an anode, a cathode, and a separation plate interposed between the anode and the cathode. The anode may include an anode material and an anode active material, and the cathode may include a cathode material and a cathode active material.

The cathode material may be, for example, aluminum, and the cathode active material may be, for example, $LiCoO_2$, but is not limited thereto, and may be a silicon based material, a tin based material, an aluminum based material, or a germanium based material.

The anode material may be, for example, copper, and the anode active material may be, for example, a carbon based material such as graphite.

Along with the demand for lightweight, thin, and small sized semiconductor devices, a thickness of the secondary battery 140 usable with the secondary memory device 100 is also required to be thin. Accordingly, the thickness d of the secondary battery 140 may be approximately 3 mm or less, for example, in a range from about 0.5 mm to about 2 mm.

The secondary battery 140 may have a capacity of approximately 50 milliampere-hour (mAh) or more. For example, the secondary battery 140 may have a capacity in a range from about 80 mAh to about 2000 mAh. Also, the secondary battery 140 may have a capacity in a range from about 200 mAh to about 1000 mAh. Also, the secondary battery 140 may have a capacity in a range from about 400 mAh to about 800 mAh. Also, the secondary battery 140 may have a capacity in a range from about 80 mAh to about 200 mAh.

Regarding the capacity of the secondary battery 140 in terms of watts W, the secondary battery 140 may have a capacity of approximately 10 W or more. For example, the secondary battery 140 may have a capacity in a range from about 16 W to about 400 W. Also, the secondary battery 140 may have a capacity in a range from about 40 W to about 200 W. Also, the secondary battery 140 may have a capacity in a range from about 80 W to about 160 W. Also, the secondary battery 140 may have a capacity in a range from about 16 W to about 40 W.

The secondary battery 140 having the above capacity may be able to be completely charged in about 2 minutes. Also, the secondary battery 140 may be able to be completely charged in about 1 minute. Also, the secondary battery 140 may be able to be completely charged in about 30 seconds.

The secondary battery 140 having the above capacity may maintain a discharge voltage for about 2 minutes or more. Also, the secondary battery 140 may maintain a discharge voltage for about 1 minute and 30 seconds or more. Also, the secondary battery 140 may maintain a discharge voltage for about 1 minute or more. Also, the secondary battery 140 may maintain a discharge voltage for about 30 seconds or more.

A charge voltage of the secondary battery 140 may be in a range from about 2 V to about 15 V. For example, a charge voltage of the secondary battery 140 may be in a range from about 2.5 V to about 12 V. Also, a charge voltage of the secondary battery 140 may be in a range from about 4 V to about 6 V. Also, a charge voltage of the secondary battery 140 may be in a range from about 10 V to about 15 V.

The secondary battery 140 may have an operating temperature in a range from about −40° C. to about 105° C. Also, the secondary battery 140 may have an operating temperature in a range from about −20° C. to about 85° C. Also, the secondary battery 140 may have an operating temperature in a range from about −150° C. to about 75° C.

The secondary battery 140 may be configured to supply power to the substrate 101 when the external power source 103 is blocked. Referring to FIGS. 1 and 2, the secondary memory device 100 may include a sensing device 107a to sense the power supply from the external power source 103 to determine whether the power is being supplied normally or abnormally. The sensing device 107a may sense an abnormal power supply and/or a power supply failure while sensing the power transmitted from the external power source 103 transmitted a connector 150 and may transmit a signal corresponding to the abnormal power supply and/or the power supply failure to a discharge switch 107b.

The discharge switch 107b may be configured to supply power from the secondary battery 140 to the substrate 101 by receiving the signal indicating the abnormal power supply and/or the power supply failure from the sensing device 107a. The discharge switch 107b may include an arbitrary switching device that may control an electrical connection between the secondary battery 140 and the substrate 101 according to the power supply status between the external power source 103 and the substrate 101.

The sensing device 107a and the discharge switch 107b described above may constitute a discharge controller 107. However, the configuration of the discharge controller 107 is not limited to the configuration depicted in FIG. 2. That is, the discharge controller 107 may be an arbitrary device that senses the supply of the external power source 103, and according to a sensing result, determines whether the supply of power from the secondary battery 140 to the substrate 101 will be performed or not.

Power supplied to components of the substrate 101 through the discharge controller 107 may be supplied to the non-volatile memory devices 111 through a voltage regulator 109.

When a power supply from an outside of the secondary memory device 100 to the secondary battery 140 stops, a charge amount charged in the secondary battery 140 may be reduced as time passes, and thus, the secondary battery 140 may need to be recharged periodically. Also, when the secondary battery 140 is used due to the abnormal power supply and/or the power supply failure from the external power source 103, the secondary battery 140 may need to be recharged.

The secondary battery 140 may be recharged by using the power from the external power source 103. In order to recharge the secondary battery 140, the external power source 103 may be configured to directly supply power to the secondary battery 140 through a conductive line or a switch disposed therebetween. It is possible that, as illustrated in FIG. 1, although power is supplied to the secondary battery 140 from the external power source 103, the supply of power to the secondary battery 140 may be controlled by interposing a charge controller 108 between the external power source 103 and the secondary battery 140.

The charge controller 108 may be respectively electrically connected to the external power source 103 and the secondary battery 140. The charge controller 108 may determine the supply of power from the external power source 103 by sensing a charge amount of the secondary battery 140. The charge controller 108 may estimate the charge amount in the secondary battery 140 by measuring a potential of an electrode or a potential difference between two electrodes (or terminals of cathode and anode) of the secondary battery 140. Furthermore, the charge controller 108 may periodically measure the potential of the electrode or the potential difference between the two electrodes of the secondary battery 140.

When a measurement result of the potential of the electrode or the potential difference between the two electrodes of the secondary battery 140 is lower than a predetermined value, the charge controller 108 may determine that the charge amount in the secondary battery 140 is insufficient. According to the above determination, the charge controller 108 may apply power to the secondary battery 140 from the external power source 103.

On the contrary, when a measurement result of the potential of the electrode or the potential difference between the two electrodes of the secondary battery 140 is equal to or higher than a predetermined value, the charge controller 108 may determine that the charge amount in the secondary battery 140 is sufficient. According to the above determination, the charge controller 108 may block the power supply to the secondary battery 140 from the external power source 103.

Figure 3:
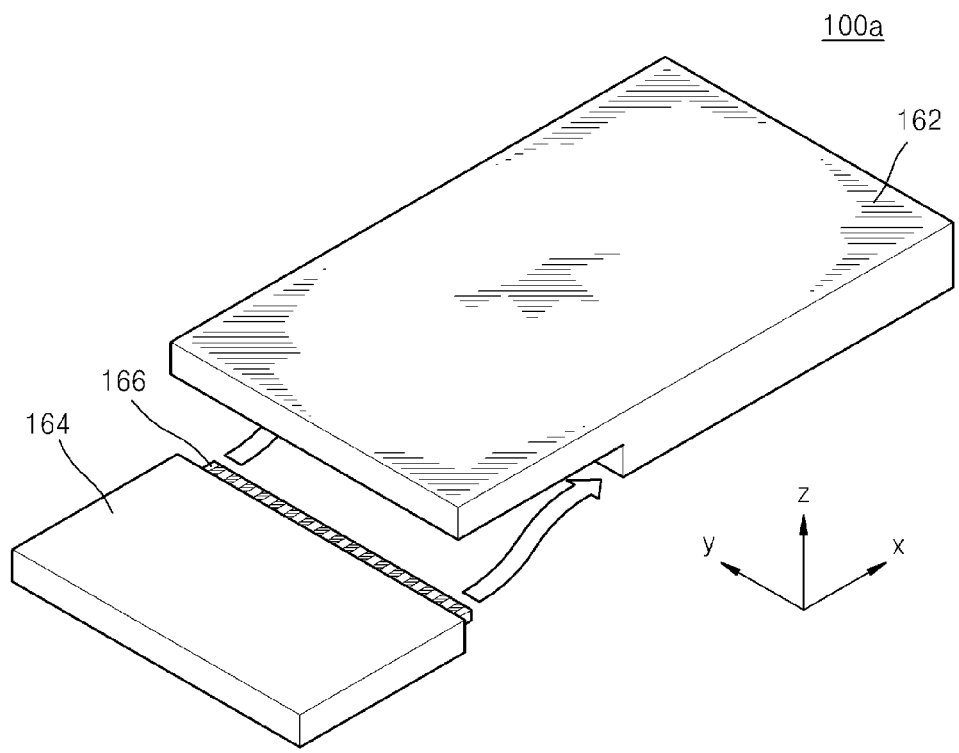
FIG. 3 is an exploded perspective view illustrating a secondary memory device according to an embodiment of the inventive concept.

FIG. 3 is an exploded perspective view illustrating a secondary memory device 100a according to another embodiment of the inventive concept.

Referring to FIGS. 2 and 3, the secondary memory device 100a may have a first housing 162 accommodating a substrate 101, and second housing 164 accommodating a secondary battery 140.

Electrode terminals of the secondary battery 140 accommodated in the second housing 164 may be electrically connected to terminals 166 that extend and are exposed outside the second housing 164. Alternatively, the electrode terminals of the secondary battery 140 and the terminals 166 that extend and are exposed outside the second housing 164 may be formed as a single integrated body.

The second housing 164 may be combined with the first housing 162 by inserting the terminals 166 into the first housing 162. The first housing 162 may include a recess unit into which the terminals 166 are inserted and accommodated. Terminals to which the terminals 166 are electrically connected may be included in the recess unit.

In FIG. 3, the terminals 166 of the second housing 164 are depicted to protrude outside the second housing 164. However, it is possible that the terminals of the first housing 162 connected to the substrate 101 may protrude outside the first housing 162 and the second housing 164 may include a recess unit so that the terminals of the first housing 162 are accommodated by being inserted into the recess unit.

In FIG. 3, the first housing 162 and the second housing 164 are combined in an insertion type in which a protrusion portion is inserted into a recessed portion. The combination of the first housing 162 and the second housing 164 may have an attachable and detachable configuration so that the first housing 162 and the second housing 164 are separated as necessary. The first housing 162 may have the connector 150 to be connected to the external power source 103 for power supply and the external device for data communication.

Although second battery technologies have been well developed, it is possible that the secondary batteries may have problems, such as leakage of electrolyte or explosion of the secondary battery. Accordingly, as illustrated in FIG. 3, information stored in the non-volatile memory devices 111 may be protected from the leaking electrolyte by accommodating the substrate 101 and the secondary battery 140 in separated housings.

Also, since the first housing 162 and the second housing 164 are combined in an attachable and detachable configuration, even if an internal or external force, for example, an imploding or exploding force, is generated or applied to the secondary battery 140, the first housing 162 and the second housing 164 may be readily separated from each other by releasing the insertion, and as a result, damage to the substrate 101 in the first housing 162 may be minimized.

A binding strength of the insertion between the first housing 162 and the second housing 164 may be controlled to be weaker than the above described force. Furthermore, the binding strength of the insertion between the first housing 162 and the second housing 164 may be controlled to be lower than the above described force such that the first housing 162 may be broken to release the second housing 164. Accordingly, if the force is generated or applied thereto, the first housing 162 and the second housing 164 are readily separated from each other by the force applied in a z direction, and thus, the insertion may be released.

The connector 150 may be disposed in a location (not illustrated) of the secondary memory device 100a and may have a portion exposed to an outside thereof to be connected to an external apparatus. It is possible that the connector 150 is disposed opposite to the secondary battery 164 with respect to a center portion of the secondary memory device 100a. However, the present general inventive concept is not limited thereto. The connector 150 may be disposed at a side of a housing of the secondary memory device 100a to be connected to a terminal of the external apparatus.

Figure 4:
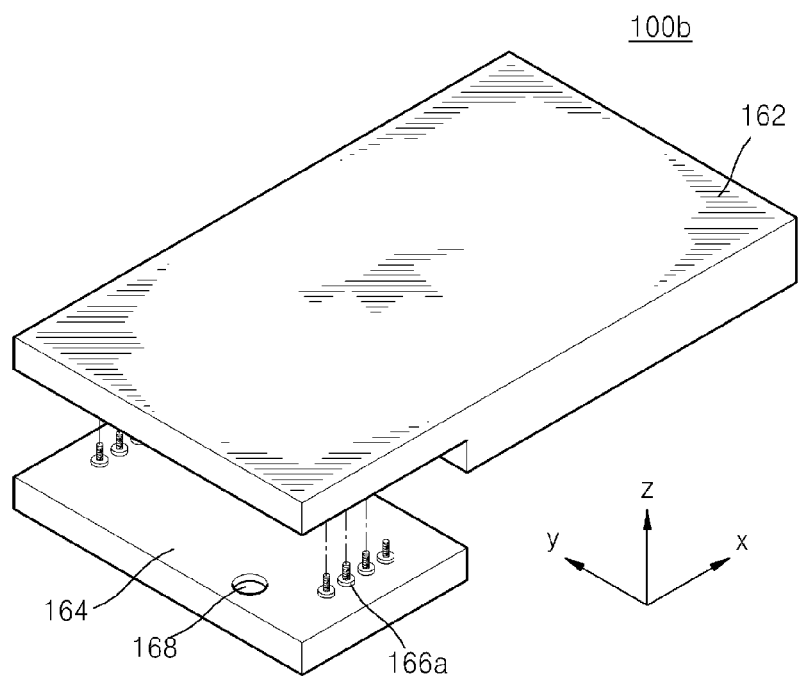
FIG. 4 is an exploded perspective view illustrating a secondary memory device according to an embodiment of the inventive concept.

FIG. 4 is an exploded perspective view illustrating a secondary memory device 100b according to an embodiment of the inventive concept. The secondary memory device 100b of FIG. 4 may be the same configuration as the secondary memory device 100a of FIG. 3 except that a location and shape of terminals 166a of the second housing 164 are different from those of the secondary memory device 100a of FIG. 3. Thus, for convenience of explanation, descriptions of the same elements will not be repeated.

In the secondary memory device 100a of FIG. 3, the first housing 162 and the second housing 164 are combined in a horizontal direction with respect to a main surface of the secondary memory device 100 that is parallel to an x-y plane. However, in the secondary memory device 100b of FIG. 4, the terminals 166a may be formed so that the first housing 162 and the second housing 164 are combined in a perpendicular direction (z direction) with respect to the main surface of the secondary memory device 100b.

Here, the main surfaces of the secondary memory devices 100 and 100a denote surfaces that have the largest surface areas that constitute the outer surfaces of the first housing 162 of the secondary memory devices 100 and 100a. In particular, in FIGS. 3 and 4, the outer surface parallel to the x-y plane may be the main surfaces.

As illustrated in FIGS. 2 and 4, when the first housing 162 and the second housing 164 are combined in the perpendicular direction (z direction) with respect to the main surface of the secondary memory device 100a, even if an internal or external force, such as imploding or exploding force, is generated or applied to the secondary battery 140 accommodated in the second housing 164, a net force applied to the first housing 162 is not greater than a binding strength of the terminals 166a with the first housing 162. As a result, the first housing 162 and the substrate 101 accommodated in the first housing 162 may be effectively protected.

In FIG. 4, the terminals 166a of the second housing 164 protrude outside the second housing 164. However, it is possible that the terminals of the first housing 162 protrude outside thereof and the second housing 164 may include a recess unit into which the terminals of the first housing 162 are inserted.

Referring to FIG. 4, the second housing 164 may include an opening 168. The opening 168 may be a hole to supply air into an inside of the second housing 164 and/or communicate with the second battery 140. The secondary battery 140 accommodated in the second housing 164 may be, for example, a lithium air battery.

In the related art, a super capacitor is used as a back-up power source. However, the super capacitor needs a booster because an electrical potential of the charged super capacity is low. However, as described above, when a secondary battery is used, a device such as a booster to raise a potential may be unnecessary. Since parts for boosting are omitted, an overall configuration of the secondary memory device becomes simple, and thus, it is possible to reduce manufacturing costs and to make secondary memory device smaller. Also, the secondary battery has a superior thermal characteristic to the super capacitor, and thus, has a longer lifetime, compared to that of the super capacitor.

The connector 150 may be disposed in a location (not illustrated) of the secondary memory device 100b. The connector 150 may have a portion exposed to an outside thereof to be connected to an external apparatus. It is possible that the connector 150 is disposed opposite to the secondary battery 164 with respect to a center portion of the secondary memory device 100b. However, the present general inventive concept is not limited thereto. The connector 150 may be disposed at a side of a housing of the secondary memory device 100b. The connector 150 may be disposed at a side of a housing of the secondary memory device 100a to be connected to a terminal of the external apparatus.

Figure 5:
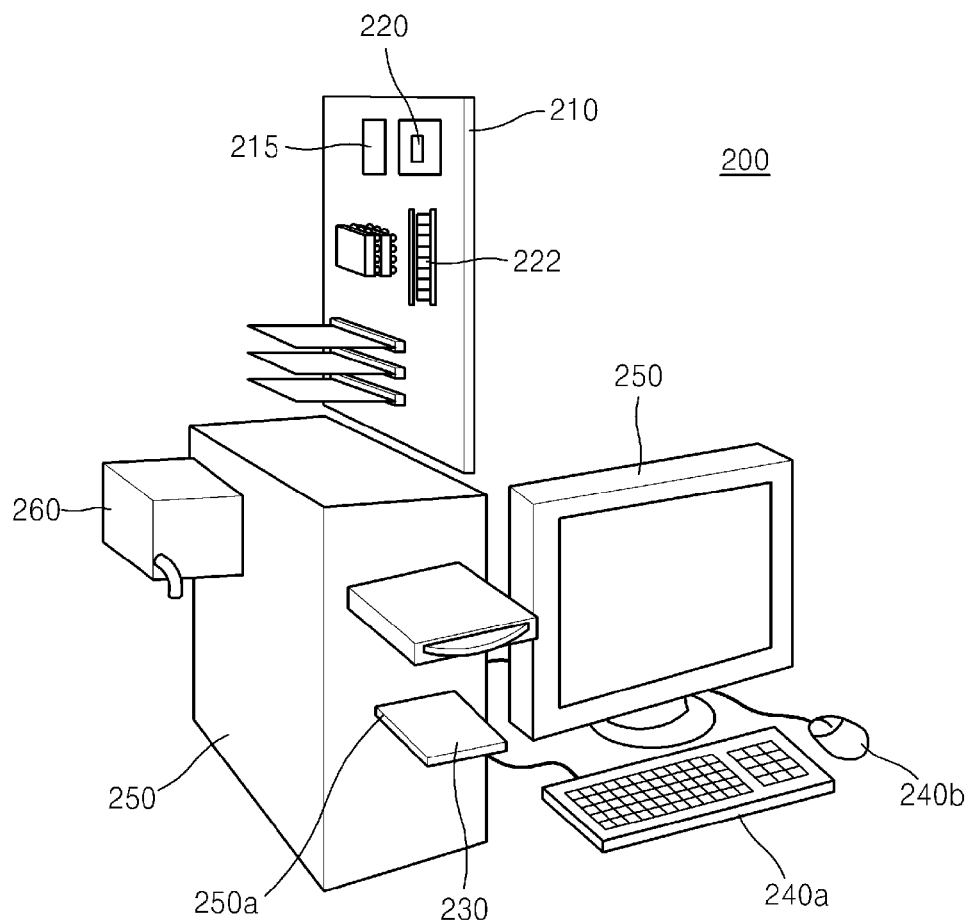
FIG. 5 is conceptual perspective view illustrating an electronic system according to an embodiment of the inventive concept.

FIG. 5 is conceptual perspective view illustrating an electronic system 200 according to an embodiment of the inventive concept.

Referring to FIG. 5, the electronic system 200 may include a main board 210, a central processing device 220 mounted on the main board 210 to perform a function of the electronic system 200 or process data, a secondary memory device 230, input devices 240a and 240b, and an output device 250. The secondary memory device 230 may be one of the secondary memory devices 100, 100a, and 100b described with reference to FIGS. 2 through 4.

The secondary memory device 230 may be detachably attached to a terminal 250a formed on a housing 250 of the electronic system 200 to transmit or receive data to or from the main board 210 of the electronic system 200. It is possible that the terminal 250a may include a recess unit to receive the secondary memory device 230 inside the housing 250. The terminal may provide electrical connection between the connector 150 of the secondary memory device 230 and components including the central processing device 220 of the main board 210 of the electronic system 200.

The input devices 240a and 240b may be a keyboard, a mouse, or a touch screen, but are not limited thereto. The input devices 240a and 240b may be devices to input data to the central processing device 220. The output device 250 may be a monitor or a printer, but is not limited thereto. The output device 250 may be a device to output data from the central processing device 220. The input devices 240a and 240b and the output device 250 may be combined in a single device.

The central processing device 220 and a main memory device 222 may be mounted on the main board 210. The main memory device 222 may be a device to store data that is processed in the central processing device 220, for example, a RAM module such as a DRAM. Also, the main board 210 may be configured to additionally mount a video card or a communication card (not illustrated). The main board 210 may be configured to exchange information with the secondary memory device 230 by using a communication standard such as SATA or SATA-II.

Also, the electronic system 200 may include a power supply device 260 to supply power required to operate the main board 210, the output device 250, the input devices 240a and 1240b and/or the secondary memory device 230. The power supply device 260 and the main board 210 may be disposed in the housing 250 of the electronic system 200. The power supply device 260 may be an external power source to supply power to the secondary memory device 230.

The electronic system 200 may also include an auxiliary device to provide a portion of a function thereof. It is possible that the auxiliary device 215 may be a power sensing circuit 215 disposed on the main board 210 to continuously or periodically sense a power state of the power supply device 260. The electronic system 200 may include an interface (not illustrated) to provide communication with an external apparatus through a network or a user through a wired or wireless method.

All of data stored in the main memory device 222 may not be maintained therein when the power supply is blocked. Therefore, when the power supply from the power supply device 260 is abnormally stopped, the data stored in the main memory device 222 needs to be stored in the secondary memory device 230.

The secondary battery of the secondary memory device may provide a power supply to at least a portion of the main memory device 222 and at least a portion of the secondary memory device 230 such that data can be transmitted from the main memory device 222 to the non-volatile memory device 111. Accordingly, a data loss is prevented and data is stored in the secondary memory device according to a power supply from the secondary battery 140 of the secondary memory device 230.

Figure 6:
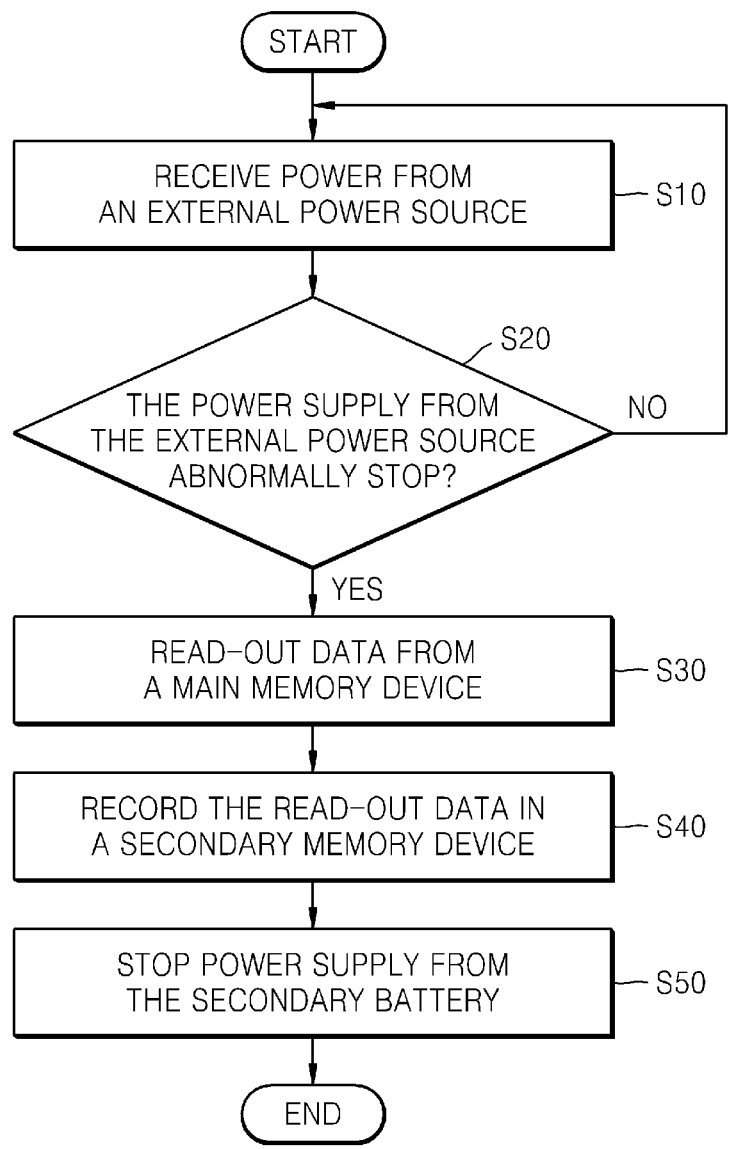
FIG. 6 is a block diagram illustrating a process of storing data in a secondary memory device when a power supply from an external power source is abnormally stopped.

FIG. 6 is a block diagram illustrating a process of storing data in the secondary memory device 230 when a power supply from an external power source is abnormally stopped.

Referring to both FIGS. 5 and 6, components of the electronic system 200 including the main board 210 receive power from the power supply device 260 at operation S10. The power sensing circuit 215 disposed on the main board 210 continuously or periodically senses whether power from the power supply device 260 is normally supplied or not at operation S20.

If the power supply from the power supply device 260 is abnormally stopped, data is read-out from the main memory device 222 at operation S30, and the read-out data is recorded in the secondary memory device 230 at operation S40. At this point, a secondary battery in the secondary memory device 230 is activated in the above process to be able to supply power to a substrate in the secondary memory device 230.

After all data of the main memory device 222 is transmitted to and recorded in the secondary memory device 230, the power supply from the secondary battery to the substrate in the secondary memory device 230 may be blocked at operation S50. In other words, after all data of the main memory device 222 is recorded in the secondary memory device 230, a controller 120 (refer to FIG. 2) may give a command to the discharge controller 107 (refer to FIG. 1) to block the power supply from the secondary battery 140 (refer to FIG. 2) to the substrate 101 (refer to FIG. 2).

Since the electronic system 200 is configured as described above, although power supply is abnormally stopped, data stored in the main memory device 222 may be safely stored in the secondary memory device 230. The secondary memory device is usable with the electronic system 200 and is formed as a less expensive and smaller sized secondary memory device according to the current inventive concept.

The electronic system 200 may be a desktop personal computer (PC), a laptop PC, a mobile computing apparatus, a smart phone, a tablet PC, a portable multimedia player (PMP), a navigation system, and a display device including a flat panel display device such as a flat panel display television and a curved panel display device or a flexible display device.

Since the secondary memory device has a small size and a secondary battery therein, the secondary memory device is useable with the above described apparatus which has a variable size, a variable shape, a limited space, or various locations of the terminals to perform a corresponding function, such that data is maintained when the power is abruptly disconnected or abnormally lowered, when a function thereof is not properly operated, or when an operation state thereof. Is not normal, at least due to a power supply or any other reasons. The secondary memory device can store the date in the above described event.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include a semiconductor memory, a read-only memory (ROM), a random-access memory (RAM), a USB memory, a memory card, a blue-ray disc, CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A secondary memory device comprising:
   a substrate configured to receive power from an external power source;
   at least one non-volatile memory device mounted on the substrate;
   a control device mounted on the substrate and configured to control the at least one non-volatile memory device; and
   a secondary battery electrically connected to the substrate and configured to supply secondary power to the substrate in response to the power supply from the external power source being abnormally stopped,
   wherein the substrate includes a connection element for receiving power from an external power source, and
   wherein a charging time of the secondary battery is one minute or less.

2. The secondary memory device of claim 1, further comprising:
   a charge controller to control charging of the secondary battery.

3. The secondary memory device of claim 1, wherein the secondary battery has a thickness in a range from about 0.5 mm to about 2 mm in a direction perpendicular to a main surface of the substrate.

4. The secondary memory device of claim 1, further comprising:
a sensing device to sense the power supply from the external power source to determine whether the power supply is normal or not; and
a discharge switch configured to supply the secondary power to the substrate in response to a signal received from the sensing device when the power supply from the external power source is abnormally stopped.

5. The secondary memory device of claim 1, wherein the substrate and the secondary battery are respectively accommodated in separate housings.

6. The secondary memory device of claim 5, wherein:
the separate housings comprises a first housing accommodating the substrate and a second housing accommodating the secondary battery; and
the second housing is attachably and detachably combined with the first housing.

7. The secondary memory device of claim 6, wherein the second housing is configured to be spontaneously separated from the first housing according to a force applied to the secondary battery.

8. The secondary memory device of claim 6, wherein the second housing is combined with the first housing in an insertion type, and the second housing is configured to be separated from the first housing by releasing the insertion according a force applied to the secondary battery.

9. The secondary memory device of claim 6, wherein the second housing comprises an opening to supply air in an inside of the second housing.

10. The secondary memory device of claim 1, wherein a device to boost a voltage is not interposed between the secondary battery and the substrate.

11. An electronic system comprising:
a central processing device;
a main memory device configured to store data processed in the central processing device;
an input device configured to input information to the central processing device to process the data;
an output device configured to output information from the central processing device according to the data; and
a secondary memory device configured to transmit information to the central processing device or to store information output from the central processing device, the secondary memory device comprising:
a substrate configured to receive power from an external power source;
at least one non-volatile memory device mounted on the substrate;
a control device mounted on the substrate and configured to control the at least one non-volatile memory device; and
a secondary battery electrically connected to the substrate and configured to supply secondary power to the substrate in response to the power supply from the external power source being abnormally stopped,
wherein the electronic system further comprises a power supply device to receive the power from the external power and to provide a power supply to the central processing unit and to selectively provide another power supply to the secondary battery device, and
wherein the substrate includes a connection element for receiving power from the external power source.

12. The electronic system of claim 11, wherein the secondary memory device further comprises:
a sensing device to sense the power supply from the external power source to determine whether the power supply is normal or not; and
a discharge switch configured to supply the secondary power to the substrate in response to a signal received from the sensing device when the power supply from the external power source is abnormally stopped.

13. The electronic system of claim 12, wherein the electronic system is configured to read out data stored in the main memory device and to record the data in the non-volatile memory devices of the secondary memory device while power is supplied from the secondary battery to the substrate when the power supply from the external power source is abnormally stopped.

14. The electronic system of claim 13, wherein the secondary memory device is configured such that, after all data in the main memory device is recorded in the non-volatile memory devices of the secondary memory device, the power supply from the secondary battery is blocked.

15. The electronic system of claim 11, further comprising:
a housing having a terminal to be electrically connected to the secondary memory device.

16. The electronic system of claim 11, further comprising:
a housing having a terminal,
wherein the secondary memory device comprises a first housing accommodating the substrate, the at least one non-volatile memory device, and the controller, and a second housing accommodating the secondary battery, and the terminal is connected to the first housing.

17. A secondary memory device usable with an electronic system, comprising:
a substrate configured to receive a first power supply from an external device via a connection element;
at least one non-volatile memory device mounted on the substrate; and
a secondary battery configured to provide a second power supply to the substrate including the at least one non-volatile memory device in response to the first power supply being terminated from the external device,
wherein a charging time of the secondary battery is one minute or less.

18. The secondary memory device of claim 17, wherein the electronic system comprises:
a power source to provide the first power supply; and
a housing having a central processing device, a main memory device, and a terminal, which operate according to the first power supply from the power source, the terminal to be connected to the secondary memory device such that information is transmitted from the secondary memory device to the central processing device or information output from the central processing device is stored in the secondary memory device.

* * * * *